US006947083B2

(12) United States Patent
Nakajima

(10) Patent No.: US 6,947,083 B2
(45) Date of Patent: Sep. 20, 2005

(54) SOLID STATE IMAGE DEVICE AND DEFECTIVE PIXEL RECORDING METHOD THEREOF

(75) Inventor: Takatsugu Nakajima, Tokyo (JP)

(73) Assignee: Sony Corporation, Tokyo (JP)

( * ) Notice: Subject to any disclaimer, the term of this patent is extended or adjusted under 35 U.S.C. 154(b) by 802 days.

(21) Appl. No.: 09/771,741

(22) Filed: Jan. 29, 2001

(65) Prior Publication Data

US 2001/0010552 A1 Aug. 2, 2001

(30) Foreign Application Priority Data

Jan. 31, 2000 (JP) ........................................ 2000-021529

(51) Int. Cl.[7] ................................................ H04N 5/64
(52) U.S. Cl. ..................................... 348/246; 348/247
(58) Field of Search ............................... 348/246, 247, 348/333.02; 378/98, 62, 87, 116

(56) References Cited

U.S. PATENT DOCUMENTS

| | | | | |
|---|---|---|---|---|
| 4,739,495 A | * | 4/1988 | Levine | 348/247 |
| 4,833,462 A | * | 5/1989 | Gover et al. | 345/157 |
| 6,661,456 B1 | * | 12/2003 | Aufrichtig et al. | 348/247 |
| 6,704,435 B1 | * | 3/2004 | Imaino et al. | 382/108 |
| 2004/0169746 A1 | * | 9/2004 | Chen et al. | 348/246 |

\* cited by examiner

*Primary Examiner*—David L. Ometz
*Assistant Examiner*—Yogesh Aggarwal
(74) *Attorney, Agent, or Firm*—Frommer Lawrence & Haug LLP; William S. Frommer; Darren M. Simon

(57) ABSTRACT

The present invention makes it possible to easily and additionally write positional information of the defective pixel which is difficult to deal with using an automated writing mode, and that, without using any special writing jig in the case where a new defective pixel is occurred in a solid state image element.

Concretely, a solid state image device in which solid state image means of N lines in the vertical direction and M pixels in the horizontal direction is arranged in a matrix comprises display means for displaying a position of a defective pixel occurred at a solid state image means, position selection means manually operated so as to select the position of the defective pixel on the screen of this display means and memory means for memorizing positional information D1 of the defective pixel selected by this position selection means. Therefore, if a new defective pixel is occurred in a solid state image means 11 after shipping the product, positional information which is difficult to deal with using the automated writing mode can be easily and additionally written, for example, in the service section without using any special writing jig.

11 Claims, 10 Drawing Sheets

<u>PRIOR ART</u>

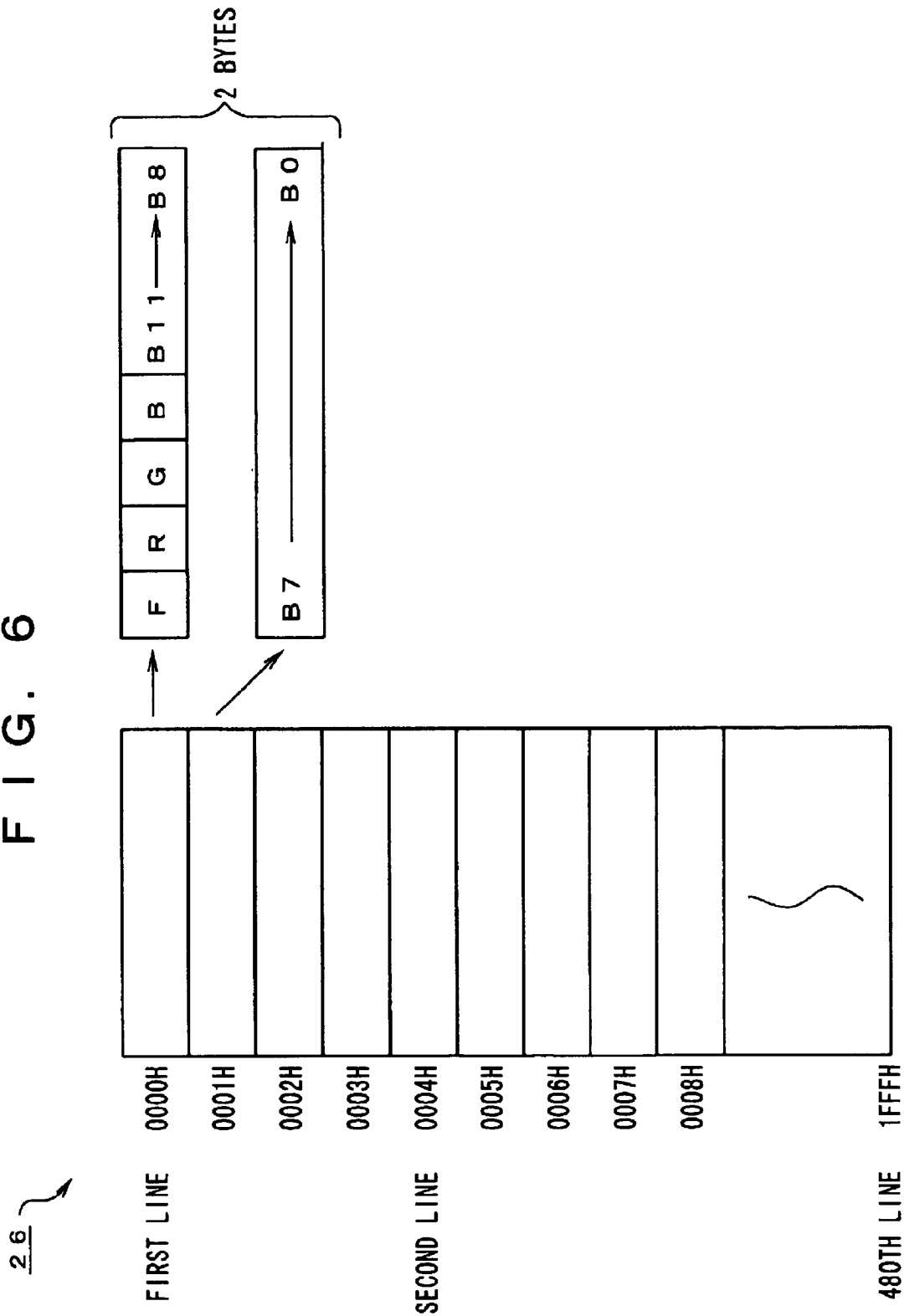

SOLID STATE IMAGE DEVICE AND DEFECTIVE PIXEL RECORDING METHOD THEREOF

BACKGROUND OF THE INVENTION

1. Field of the Invention

The present invention relates to a solid state image device and its defective pixel recording method which is applied to CCD camera arranging a solid state image element in a matrix shape and in a high density and is preferable. More particularly, the present invention is characterized in that position selection means for selecting a position of defective pixel on the screen is provided, this position selection means is manually operated and positional information of selected defective pixel is recorded in the memory means, if a new defective pixel is occurred in a solid state image element after shipping the product, without using any special jig for writing, in addition, positional information which is difficult to deal with by the automated writing mode has been made easily additionally written.

2. Description of the Related Art

Recently, there have been many cases where a video camera is used in which a solid state image element (CCD) is arranged in a high density and in a matrix shape. In this kind of video camera, pixels which are not normally operated in a certain rate (hereinafter, as referred to defective pixel) are generated and appeared as dotted fixed noises (so called white and bright defect: white defect) on the screen. It is considered that this was occurred because pn junction of light electronic conversion element is destroyed or somehow done by intervention of cosmic rays and radiation on the way of traveling after shipping the product or at the place where the camera is set. Therefore, there have been many cases where defective correction system for removing its influence by adjusting white defect is mounted in CCD camera.

According to the defective correction system 10 of the CCD camera 1 shown in FIG. 1, a defective pixel recording method using one time ROM is employed, and an image acquisition information related to defective pixel is adjusted by memorizing the adjusted data into ROM2. As for white defect which is occurred posteriorly, after existing ROM2 is removed from the CCD camera in step B1 of flowchart shown in FIG. 2, a new ROM2 is set in the writing jig 3. Then, in step B3, the position of defective pixel is measured, and after that, in step B4, a corrected data to an image acquisition information related to defective pixel is prepared, this is written into a new ROM2, and then, in step B5, the ROM2 is removed from the writing jig 3 and mounted so as to exchange with the old ROM2 set in the CCD camera 1.

Now, according to the defective correction system 10 using one time ROM, since it needs the writing jig 3 which is exclusive such as ROM writer and the like, burden is heavy from the point of view of facilities. Then, a method of mounting a non-volatile memory in the CCD camera, detecting a position related to defective pixel by scanning on the screen with camera itself, and employing automatic writing mode in which the correction data prepared based on its positional information is written into a memory is designed.

However, white defect, which can be dealt with by automatic writing mode, may remain. For example, there is a problem that it is difficult to selectively correct white defect as repeating flickering periodically, and white defect and the like which cannot be deleted because of the limitation of defective correction system.

It should be noted that the limitation of defective correction system is occurred in a case where correction number related to defective pixel on the identical line is defined, refers to a fact that defective pixel exceeding over its correction number of pieces cannot be recorded. Moreover, white defect which could not be deleted due to the limitation of the defective correction system refers to a portion which is white and bright due to defective pixels exceeding over the correction number of pieces on the same line.

SUMMARY OF THE INVENTION

The present invention is one, which has resolved such conventional problems, and an object of the present invention is to provide a solid state image device and its defective pixel recording method in which positional information of defective pixel are capable of easily and additionally being written without using any special writing jig, but are difficult to deal with by an automated writing mode in the case where a new defective pixel in a solid state image element is occurred.

The above described problem is solved by a solid state image device of N lines in the vertical direction and M pixels in the horizontal direction characterized in that this solid state image device is arranged in a matrix shape, comprises display means for displaying a position of defective pixel occurred at a solid state image element, position selection means manually operated so as to select a position of defective pixel on the screen of this display means and memory means for memorizing positional information of defective pixels selected by this position selection means.

According to the solid state image device of the present invention, in the case where positional information of a defective pixel is newly recorded, the position of the defective pixel occurred in the solid state image element is displayed on the screen by the display means. The position selection means is manually operated so as to select the position of the defective pixel on the screen of this display means.

For example, the horizontal cursor is manually operated in the vertical direction on the screen of the display means and the vertical cursor is operated in the horizontal direction on the screen. Manually operated so that the writing determination button is pressed at the intersection of the horizontal cursor and the vertical cursor. The positional information of the selected defective pixel is recorded in the memory means by this position selection means.

Accordingly, in the case where a new defective pixel is occurred in the solid state image element after shipping the product, positional information of a defective pixel, which is difficult to deal with in automated writing mode, can be easily written into the memory means in, for example, the service section without using any special writing jig.

A defective pixel recording method of a solid state image device of the present invention is a recording method of a defective pixel in the solid state image device in which a solid state image element of N lines in the vertical direction and M pixels in the horizontal direction arranged in a matrix shape, characterized in that a position of a defective pixel occurred in a solid state image element is displayed on the screen, the position of the defective pixel is selected by manual operation and the positional information of the defective pixel which has been selected here is recorded in the memory means.

According to a defective pixel recording method of a solid state image device of the present invention, since the manual writing mode determining the writing is carried out, for example, by superimposing the intersection of the horizontal cursor and the vertical cursor on the position of the defective pixel on the screen, in the case where a new defective pixel is occurred in the solid state image element after shipping the product, the positional information can be easily written in the memory means without using any special writing jig. Accordingly, as for a defective pixel occurred posteriorly, it can be also handled with flexibility.

BRIEF DESCRIPTION OF THE DRAWINGS

For a more complete understanding of the present invention and the advantages thereof, reference is now made to the following detailed description taken in conjunction with the accompanying drawings, in which:

FIG. 6 is a conceptual drawing showing an assigned example of writing area in the EEPROM 26 of the present invention;

DESCRIPTION OF THE PREFERRED EMBODIMENTS

Subsequently, one embodiment of a solid state image device and its defective pixel image recording method of the present invention will be described below with reference to the drawings.
(Example 1)

Figure 1:
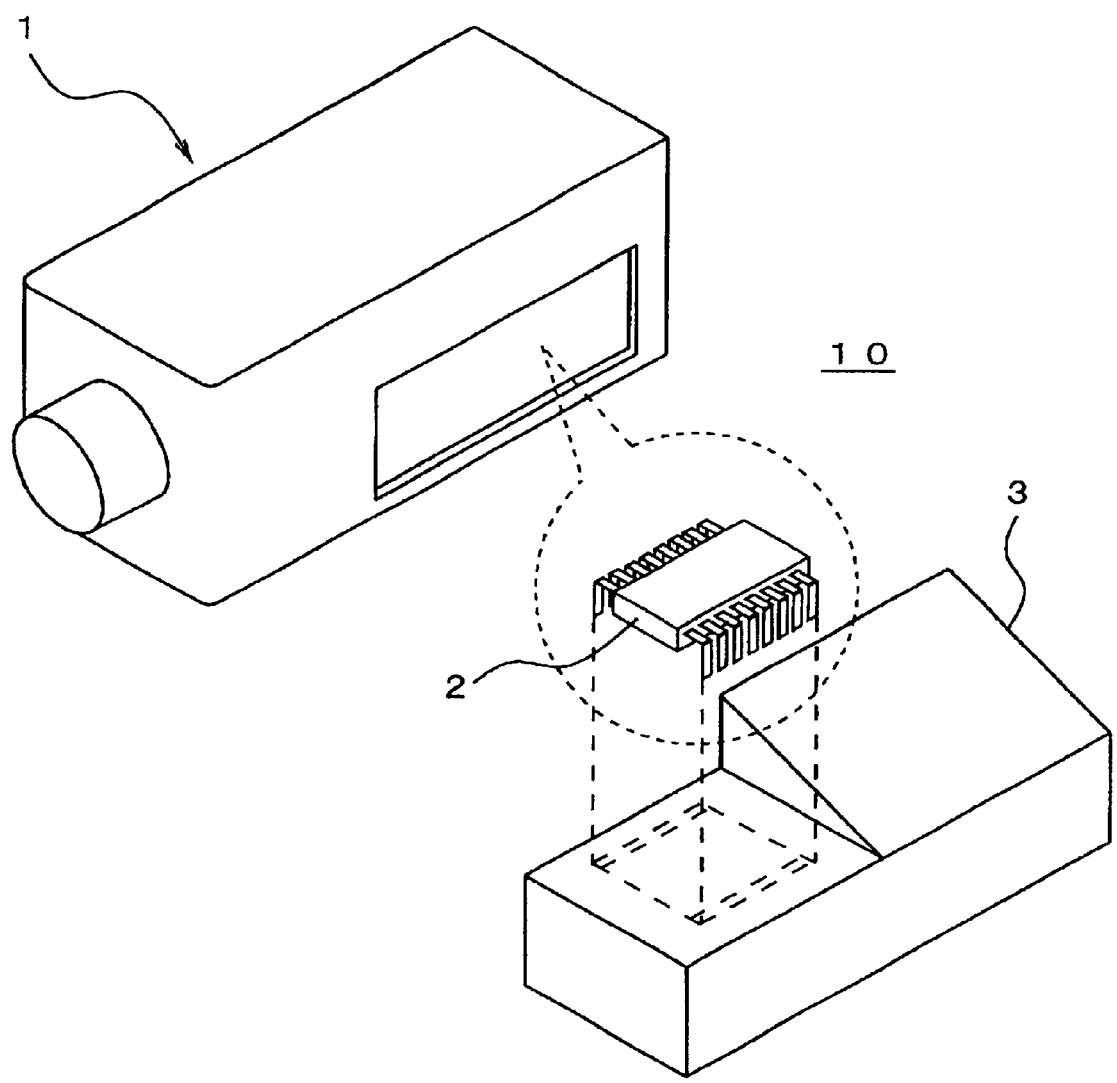
FIG. 1 is a perspective drawing showing a constitutive example of the defective correction system 10 of the CCD camera 1 of the conventional example.
Figure 2:
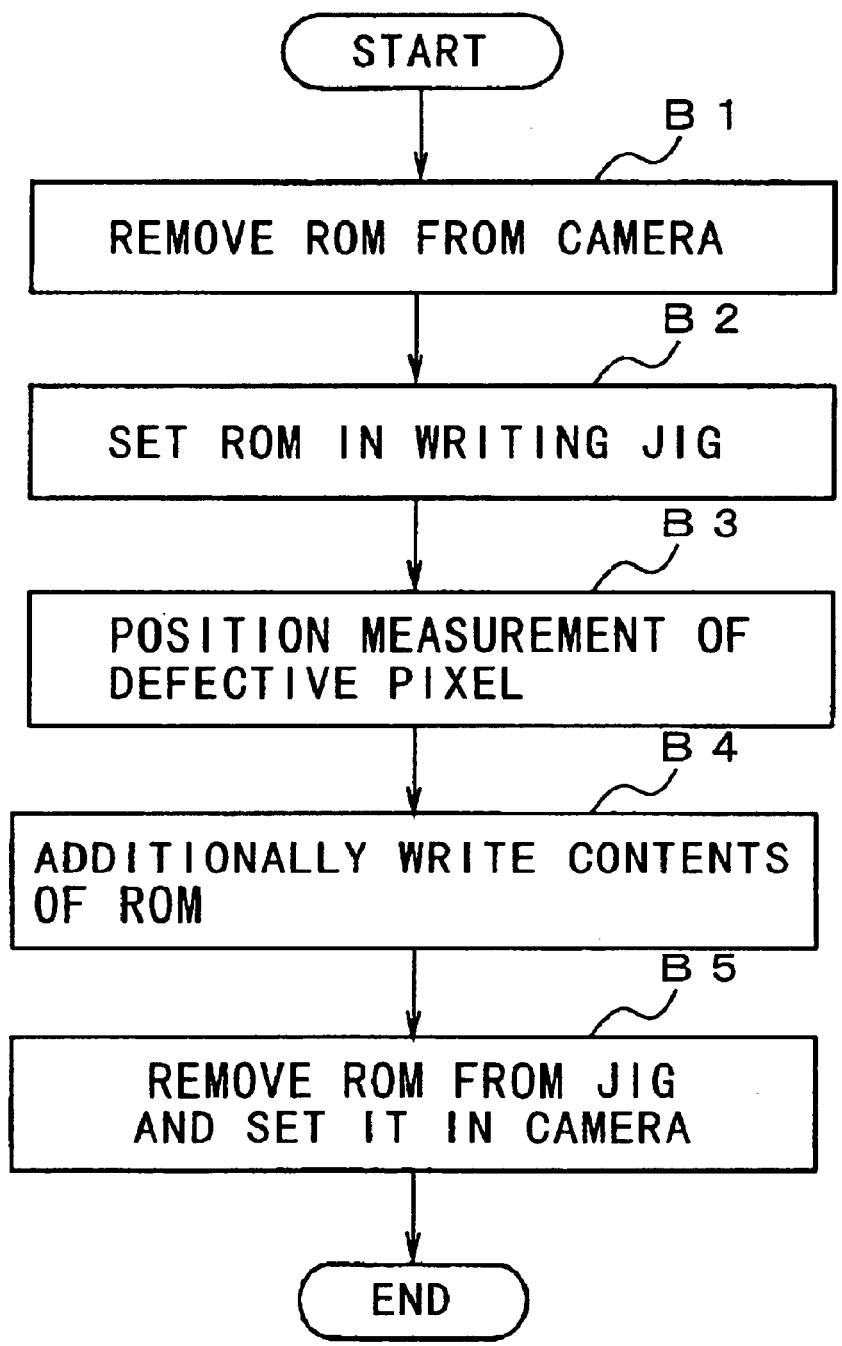
FIG. 2 is a flowchart showing a recording example of a defective pixel in the defective correction system 10 of the conventional example.
Figure 3:
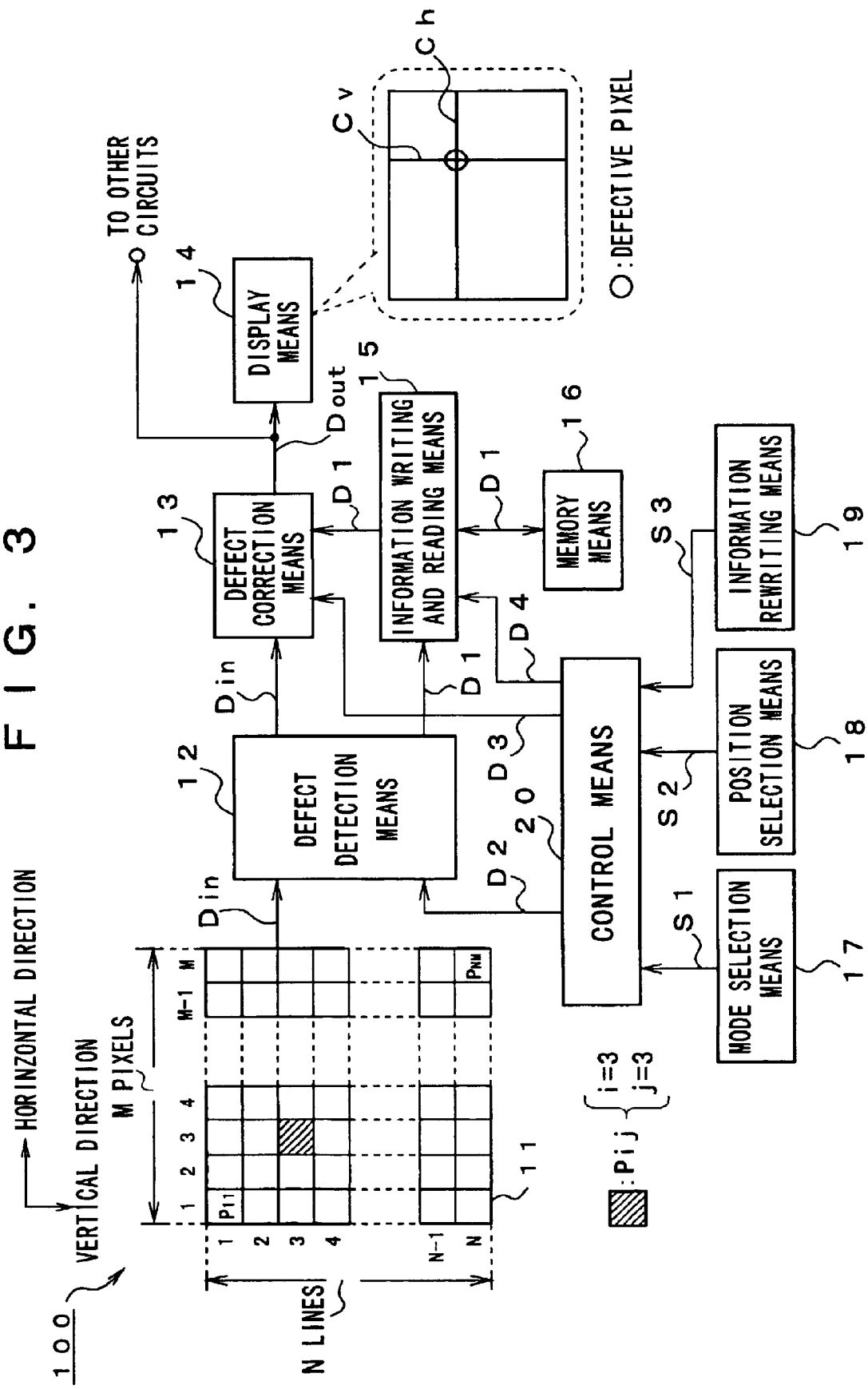
FIG. 3 is a block diagram showing an example of the solid state image device 100 as one embodiment of the present invention.

FIG. 3 is a block diagram showing an example of constitution of the solid state image device 100 as one embodiment of the present invention.

In this embodiment, the position selection means for selecting the position of the defective pixel on the screen is provided, the positional information of the defective pixel selected by manually operating this position selection means is to record in the memory means, in the case where a new defective pixel occurred in the solid state image element after shipping the product, it is so constituted such that correction of the defective pixel occurred postpriorly can be also handled with flexibility as well as the positional information of the defective pixel which is difficult to deal with by the automated writing mode can be easily additionally written without using any special writing jig.

The solid state image device 100 of the present invention has the solid state image means 11, comprises a step of the solid state image element pij (i=1–N, J=1–M) of N lines in the vertical direction and M pixels in the horizontal direction being arranged in a matrix shape. Each solid state image element pij is done so that an image acquisition information Din is output. The defective detection means 12 is connected to the solid state image means 11, the defective detection means 12 is done so that the defective detection means 12 detects the positional information D1 of the defective pixel occurred in the relevant line of the solid state image means 11 during selecting the automated writing mode. Here, the automated writing mode is referred to an operation determining the writing by automated scanning of an acquisition image acquired by the solid state image means 11 and detecting the position of the defective pixel.

In this example, in a state where incident light to the solid state image means 11 is intercepted, the solid state image means 11 of N lines×M pixels is line scanned in turn. The defective detection means 12 recognizes luminance which each solid state image means 11 has converted photoelectorically. Each recognized luminance is compared with the reference luminance previously determined so that, according to the comparative results, the positional information D1 of the defective pixel occurred in the relevant line can be detected.

To this defective detection means 12, the display means 14 is connected through the defective correction means 13, the position of the defective pixel occurred in the solid state image means 11 during selecting the manual writing mode is displayed, and at the same time, the horizontal cursor Ch and the vertical cursor Cv are displayed on the screen as well. As used herein, the term "manual writing mode" is referred to an operation which not only manually operates the horizontal cursor Ch in the vertical direction, but also manually operates the vertical cursor Cv in the horizontal direction, and determines writing by superimposing the intersection of the horizontal cursor Ch and the vertical cursor Cv on the position of the defective pixel.

To this defective correction means 13, the memory means 16 is connected through the information writing and reading means 15, the positional information D1 of the defective pixel occurred in the solid state image means 11 is recorded by the information writing and reading means 15. In this example, the writing area from the first line to the Nth line is assigned in the memory means 16 so that the positional information D1 of the defective pixel of m pieces portion per one line can be previously written. Thus, the positional information D1 of the defective pixel occurred on the relevant line of the solid state image means 11 may be recorded in the writing area of the memory means 16 corresponding to the relevant line. The positional information D1 of the defective pixel is recorded in the memory means 16 during selecting the automated writing mode or the manual writing mode.

To this defective detection means 12, besides the defective correction means 13, the mode selection means 17, the position selection means 18 and the information rewriting means 19 are connected through the control means 20. It is operated in the mode selection means 17 so that any one of the automated writing mode or the manual writing mode is selected, and the mode selection signal S1 is output into the control means 20. It is manually operated in the position selection means 18 so that the position of the defective pixel on the screen of the display means 14 is selected, and the position selection signal S2 is output into the control means 20.

In the information rewriting means 19, it is operated so that the positional information D1 of the defective pixel recorded in the memory means 16 is deleted and the positional information D1 is rewritten, and the rewriting signal S3 is output into the control means 20. In the control means 20, the defect detection control information D2, the defect correction control information D3 and the writing and reading control information D4 are occurred based on the mode selection signal S1, the position selection signal S2 and the rewriting signal S3, the defect detection means 12 is controlled based on the defect detection control information D2, the defect correction means 13 is controlled based on the defect correction control information D3, and the information writing and reading means 15 is controlled based on the writing and reading control information D4.

In the above described information writing and reading means 15, when the automated writing mode is selected, it is operated so that the positional information D1 of the defective pixel detected by the defect detection means 12 based on the writing and reading control information D4 is recorded in the writing area of the memory means 16 corresponding to the relevant line, and during its correction, the positional information D1 of the defective pixel is read out from the writing area. When the manual writing mode is selected, it is performed so that the positional information D1 of the defective pixel selected by the position selection means 18 is recorded in the writing area of the memory means 16 corresponding to the relevant line, and during its correction, the positional information D1 is read out from the writing area.

The defect correction means 13 is connected to this information writing and reading means 15, and as for the image acquisition information Din of the defective pixel recorded in the memory means 16, it is performed so that at least the image acquisition information Din of the defective pixel is interpolated based on the image acquisition information Din of which locations are in front and in the rear of the defective pixel due to the solid state image means. The image output information Dout after interpolation is output into the display means 14 and the other circuits.

Figure 4:
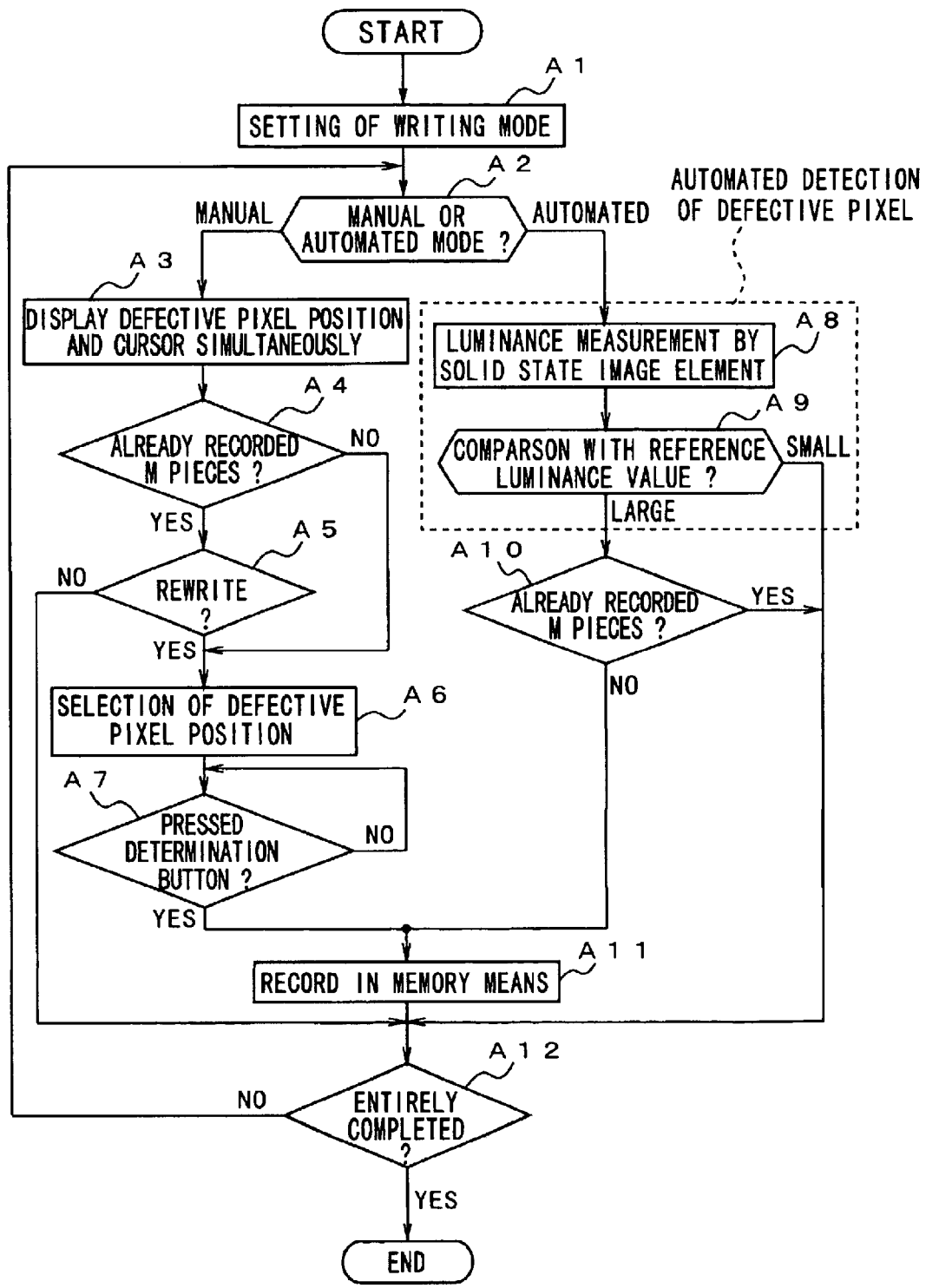
FIG. 4 is a flowchart showing an example of operation of the solid state image device 100 of the present invention.

Subsequently, as for the defective pixel recording method of the solid state image device 100 of the present invention, an example of an operation will be described below. FIG. 4 is a flowchart showing an example of an operation of the solid state image device 100.

In this embodiment of the present invention, the solid state image means 11 of N lines in the vertical direction and M pixels in the horizontal direction is a recording method of the defective pixel in the solid state image device 100 arranged in a matrix shape, the position of the defective pixel occurred in the solid state image means 11 is displayed on the screen, the position of the defective pixel displayed on this screen is manually operated and selected, and supposing the case where the positional information D1 of the defective pixel selected here is recorded in the memory means 16.

Moreover, when the positional information D1 of the defective pixel is recorded in the memory means 16, the writing area from the first line to the Nth line is prepared in the memory means 16 so as to previously write the defective pixel of m pieces portion per one line, and subsequently, the case where the positional information D1 of the defective pixel occurred on the relevant line of the solid state image device 11 is recorded in the writing area of the memory means 16 corresponding to the relevant line will be cited.

On the premise of this, in the case where the positional information D1 of the defective pixel newly occurred, first, the writing mode of the positional information D1 of the defective pixel in the step A1 of the flowchart shown in FIG. 4 is set. At this moment, in a state where incident light to the solid state image means 11 is intercepted, the position of the defective pixel occurred in the solid state image means 11 is displayed by the display means 14 on the screen.

As for the method of interception of incident light to the solid state image means 11, for example, the interception is performed such that iris of the solid state image device 100 is closed. Subsequently, transfer to the step A2, the positional information D1 of the defective pixel is recorded corresponding to the case where the manual writing mode is set and the case where the automated writing mode is set.

(1). A case where the manual writing mode is set:

In order that the position of the defective pixel displayed on the screen should be chosen by an operator, transfer to the step A3, the horizontal cursor Ch and the vertical cursor Cv are displayed at the same time on the screen of the display means 14. Subsequently, in the step A4, whether or not the positional information D1 of the defective pixel of m pieces portion per one line is recorded in the memory means 16 is determined. At this moment, whether the record of the positional information D1 of one line is present or absent is determined by accessing the writing area from the first line to the Nth line.

In the case where the positional information D1 of the defective pixel of m pieces portion per one line is not recorded in the memory means 16, transfer to the step A6, in order that the position of the defective pixel should be chosen by an operator, in the display means 14, not only the horizontal cursor Ch is manually operated in the vertical direction, but also the vertical cursor Cv is manually operated in the horizontal direction due to the output of the position selection means 18 which is operated by the operator.

Then, when the operator superimposes the intersection of the horizontal cursor Ch and the vertical cursor Cv on the position of the defective pixel, the determination button of the position selection means 18 is pressed in order to determine the writing in the step A7. Subsequently, in the step A11, the positional information D1 of a new defective pixel is recorded in the memory means 16.

It should be noted that in the case where the positional information D1 of the defective pixel of m pieces per one line is recorded in the memory means 16 in the step A4, the step transferres to the step A5, and whether or not the positional information D1 of the defective pixel recorded in the memory means 16 is determined. In the case where the larger defective pixel than the defective pixel recorded in the memory means 16 is found out, the positional information of the defective pixel recorded in the memory means 16 is deleted. This is for the purpose of writing the positional information D1 of a new defective pixel instead of the old positional information D1.

Subsequently, transfer to the step A6, in order that the position of the defective pixel should be selected by an operator, the operator manually operates the vertical cursor Cv in the horizontal direction. Then, when the operator superimposes the intersection of the horizontal cursor Ch and the vertical cursor Cv on the position of the defective pixel, the determination button is pressed in order to determine the writing in the step A7 and whereby the old positional information D1 can be rewritten to the positional information D1 of a new defective pixel in the step A11.

(2). A case where the automated writing mode is set:

In order to automatically detect a defective pixel, transfer to the step A8, the solid state image means 11 of N lines×M pixels is in turn line-scanned and the defect detection means 12 recognizes the luminance which the respective solid state image means 11 have converted photoelectrically. Subsequently, transfer to the step A9, each recognized luminance is compared with the reference luminance previously predetermined. The positional information D1 of the defective pixel occurred on the relevant line is detected corresponding to this comparison results.

Here, in the case where each luminance due to the solid state image means 11 is larger than the reference luminance previously set, transfer to the step A10, whether or not the positional information D1 of the defective pixel of m pieces per one line is already recorded in the memory means 16 is detected.

In the case where the positional information D1 of the defective pixel of m pieces is already recorded in the memory means 16, transfer to the step A12. In the case where the positional information D1 of the defective pixel of m pieces is not recorded in the memory means 16, transfer to the step A11, and the positional information D1 of a new defective pixel is recorded in the memory means 16. In the case where each luminance due to the solid state image means 11 is smaller than the reference luminance previously set, transfer to the step A12, whether or not the writing of the positional information D1 of the defective pixel is entirely completed is determined. In the case of the manual writing mode, the termination indication from the operator is detected and then the writing operation is terminated. In the case of the automated writing mode, the termination of the line scanning is detected and then the writing operation is terminated. In the case where the writing of the positional information D1 of the defective pixel is not entirely completed, return to the step A2, and the process from the step A3 to the step A11 will be continued.

Accordingly, in the case where a new defective pixel is occurred after the shipping of the product of the refined solid state image means 11, the positional information D1 of the defective pixel which is difficult to deal with by the automated writing mode can be easily written in the memory means 16, for example, in the service section without using any special writing jig.

In this embodiment of the present invention, although the case where the image acquisition information Din of one channel portion is image processed has been described above, off course, it can be applied to the three channel process systems outputting the image acquisition information Dout of red (R), green (G) and blue (B) using 3 CCD camera.

(Example 2)

Figure 5:
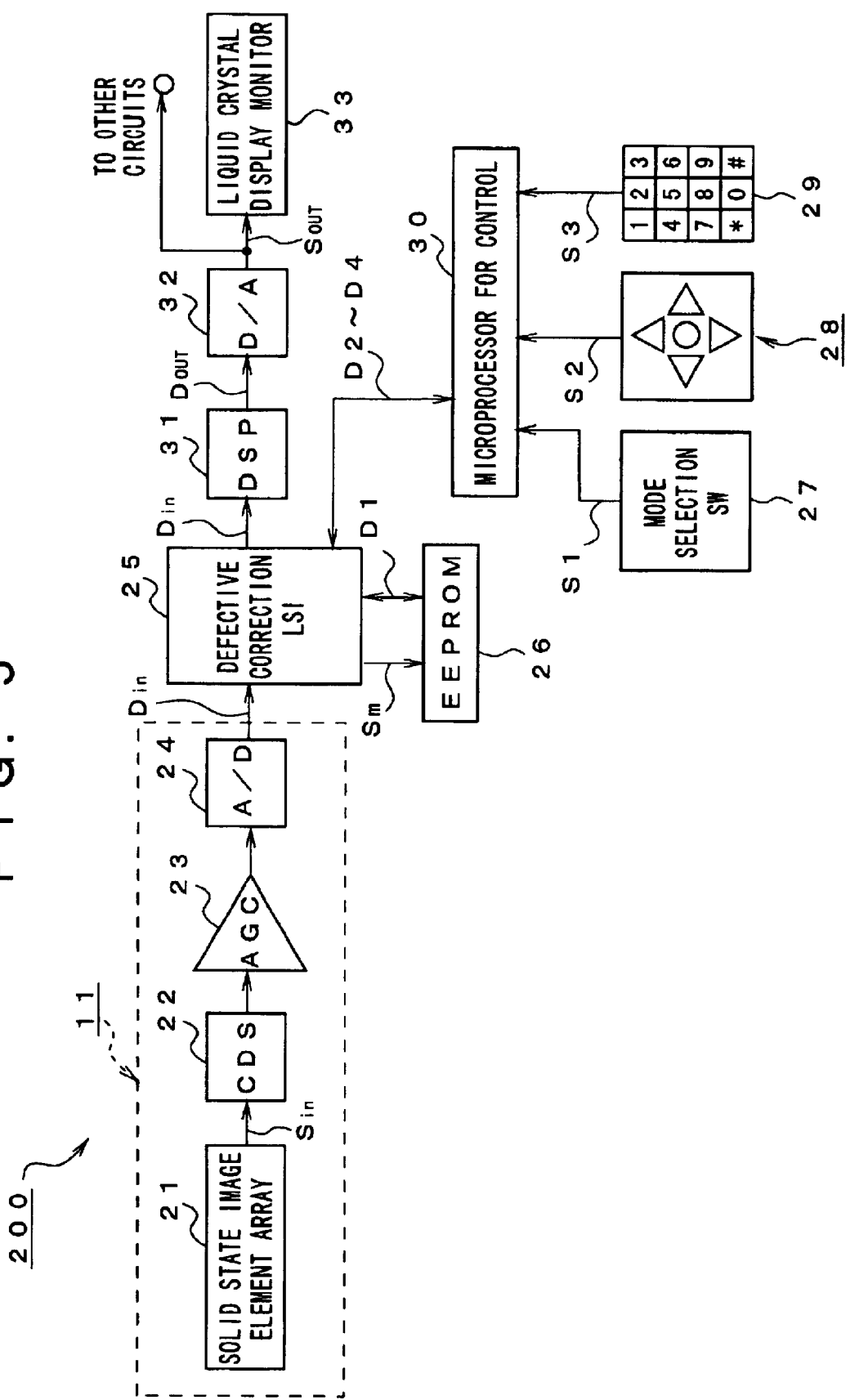
FIG. 5 is a block diagram for one channel showing a constitutive example of 3 CCD camera 200 as an example of the present invention.

FIG. 5 is a block diagram of one channel portion showing an example of constitution of a 3 CCD camera as one embodiment of the present invention. In this example, the defect detection means 12 shown in FIG. 3, the defect correction means 13 and the information writing and reading means 15 are integrated into one of the defect correction LSI 25, it is constructed so that the digital picture image signal Din is passed through, detection of the solid state image element array 21 of the defective pixel (flaw) shown in FIG. 5, its correction and cursor display is made perform within the identical LSI, and it is made capable of apply to a variety of models of CCD cameras.

In FIG. 5, although 3 CCD camera 200 has three solid state image means 11 outputting image acquisition information for red, green and blue (hereinafter, referred to as digital picture image signal Din), in this example, a case of the solid state image means 11 outputting the digital picture image signal Sin for red will be cited as one example and described below.

The solid state image means 11 has the solid state image element array 21, CDS (Co-related Double Sample-hold) circuit 22, AGC (Auto-Gain Control) circuit 23 and the analog/digital conversion circuit (hereinafter, referred to as A/D conversion circuit) 24.

The solid state image element array 21 is consisted of solid state image elements Pij (i=1–N, j=1–M) of N lines in the vertical direction and M pixels in the horizontal direction being arranged in a matrix shape. In NTSC method, the number of N is 480 lines, the number of M is 640 pixels. The CDS circuit 22 is connected to the solid state image element array 21, and the noises are removed from the image acquisition signal Sin. The AGC circuit 23 is connected to the CDS circuit 22, and it is constructed so that the gain of the image acquisition signal Sin is adjusted. The A/D conversion circuit 24 is connected to the AGC circuit 23, and the digital picture image signal (image acquisition information) Din after the image acquisition signal Sin is A/D converted) is output.

The defect correction LSI 25 is connected to the A/D conversion circuit 24, and it is constructed so that the positional information D1 of the defective pixel occurred on the relevant line of the solid state image element array 21 during selecting the automated writing mode. The defect correction LSI 25 is a circuit in which the defect detection means 12, the defect correction means 13, the information writing and reading means 15 and the timing occurrence means (not shown) and the like are integrated into one of IC chips. In this example, in a state where an incident light to the solid state image element array 21 is intercepted, the solid state image element array 21 of 480 lines×640 pixels is in turn line-scanned. The defect correction LSI 25 recognizes luminance information according to the respective solid state image means 11. The respective recognized luminance are compared with the reference luminance previously set, so that the positional information D1 of the defective pixel occurred on the relevant line can be detected corresponding to this comparison results.

A non-volatile memory is connected to this defective correction LSI 25 as a memory means, and the positional information D1 of the defective pixel occurred in the solid state image element array 21 is recorded based on the memory control signal Sm. A parallel type EEPROM 26 is used for a non-volatile memory. This type is used because it enables information writing and reading and is suitable for a high-speed performance.

Moreover, a microcomputer (hereinafter, referred to as microprocessor) 30 for control besides the EEPROM 26 is connected to the defective correction LSI 25 shown in FIG. 5, and the mode selection switch 27, the cross hair key 28 with the determination button and the ten-key numeral pad 29 are connected to this microprocessor 30. An input tool for use in a conventional camera acquisition operation is used for both of the cross hair key 28 and the ten-key numeral pad 29. The switch 27 for mode selection is an example of mode selection means, it is operated so that either of the automated writing mode or the manual writing mode is selected, and the mode selection signal S1 is output into the microprocessor 30. For example, the mode selection signal S1 of a high level indicating the automated writing mode is output by turning on the switch 27, and the mode selection signal S1 of a low level indicating the manual writing mode is output by turning-off the switch 27.

The cross hair key 28 with the determination button is an example of position selection means, it is manually operated so that the defective pixel is selected on the screen of the liquid crystal display monitor 33, and the position selection signal S2 is output into the microprocessor 30. The ten-key numeral pad 29 is an example of information rewriting means, and has numeral keys from "0" to "9", "*" key and "#" key. For example, the positional information D1 which is recorded in the EEPROM 26 and is of the defective pixel of the solid state image means 11 for red color is deleted by "*" key, the numeral key of "1" is operated so that the positional information D1 of the defective pixel is rewritten, and the rewriting signal S3 is output into the microprocessor 30. Similarly, in the case where the positional information D1 of the defective pixel of the solid state image means 11 for green color is rewritten, the numeral key of "2" is operated. And in the case where the positional information D1 of the defective pixel of the solid state image means 11 for blue color is rewritten, the numeral key of "3" is operated.

In the microprocessor 30, the defect detection control information D2, the defect correction information D3 and the writing and reading control information D4 are occurred base on the mode selection signal S1, the position selection signal S2 and the writing signal S3, and the defect correction LSI 25 is controlled based on the defect detection control information D2, the defect correction LSI 25 is controlled based on the defect correction control information D3 and the writing and reading control information D4.

In this defect correction LSI 25, in the case where the automated writing mode is selected, the positional information D1 of the defective pixel is recorded in the writing area of the EEPROM 26 corresponding to the relevant line on the basis of the writing and reading control information D4, and it is operated so that the positional information D1 of the defective pixel is read out from the writing area during its correction. In the case where the manual writing mode is selected, the positional information D1 of the defective pixel selected by the cross hair key 28 with the determination button is recorded in the writing area of the EEPROM 26 corresponding to the relevant line and the positional information D1 is read out from the writing area during its correction.

Moreover, In the defect correction LSI 25, as for the digital picture image signal Din of the defective pixel recorded in the EEPROM 26, it is operated so that at least the digital picture image signal Din of the defective pixel is interpolated on the basis of the digital picture image signal Din due to the solid state image element array 21 in front and in the rear of the defective pixel. The digital signal processor (hereinafter, referred to as DSP) 31 besides the EEPROM 26 and the microprocessor 30 to this defect correction LSI 25, and the digital picture image signal Dout after the interpolation is signal processed.

The digital/analog conversion circuit (hereinafter, referred to as D/A conversion circuit) 32 is connected to this DSP 31, and the digital picture image signal Dout is converted into the analog picture image signal Sout. The liquid crystal display monitor 33 is connected to the D/A conversion circuit 32 as a display means, and the position of the defective pixel occurred in the solid state image element array 21 during selecting the manual writing mode is not only displayed on the screen on the basis of the analog picture image signal Sout, but also the horizontal cursor Ch and the vertical cursor Cv are displayed at the same time as well.

On the screen of this liquid display monitor 33, the horizontal cursor Ch is operated in the vertical direction on the basis of the position selection signal S2 occurred by operating the cross hair key 28 with the determination button, and the vertical cursor Cv is operated in the horizontal direction on the screen. It is operated so that the determination button is pressed of the cross hair key 28 at the intersection of this horizontal cursor Ch and the vertical cursor Cv. It should be noted that the analog picture image signal Sout after D/A conversion is also output into the other circuits.

Subsequently, an example of assignment of the writing area of the positional information D1 in the EEPROM 26 will be described below. FIG. 6 is a conceptual diagram showing an example of assignment of the writing area in the EEPROM 26.

In this example, in order to previously write positional information D1 of defective pixel of two pierces per one line the line shown in FIG. 6 is assigned in the EEPROM 26, and it is performed so that the positional information D1 of the defective pixel occurred on the relevant line of the solid state image element array 21 is recorded in the writing area of the EEPROM 26 corresponding to the relevant line.

In this example, in order to record the positional information D1 of the defective pixel of one piece, two bites are assigned. The bit information of "FRGB" as a upper order address and the horizontal position bit B11–B8 are written in byte 1 shown in FIG. 6. The horizontal position bit B7–B0 as a lower order address is written in bit 2. F flag is a bit information indicating a defective data written at the time of shipping from the factory. R, G and B flags are bit information indicating channels (any one of the solid state image means 11 for red color, green color and blue color) generating a defective pixel in the 3 CCD camera 200, and the horizontal position bit B0–B11 is a linear address of 12 bits indicating the horizontal position information Dh of the defective pixel. The number of the horizontal pixels is 4096 at the maximum. The positional information D1 of the defective pixel is recorded in the EEPROM 26 during selecting the automated writing mode or the manual writing mode.

Subsequently, an example of the cursor display and an example of an operation of the cross hair key 28 in the liquid crystal display monitor 33 will be described below. For example, the cross hair key 28 shown in FIG. 7 has not only the determination button 28E in the center, but also has the triangular key facing rightward 28A, the triangular key facing leftward 28B, the triangular key facing upward 28C and the triangular key facing downward 28D.

Figure 7A:
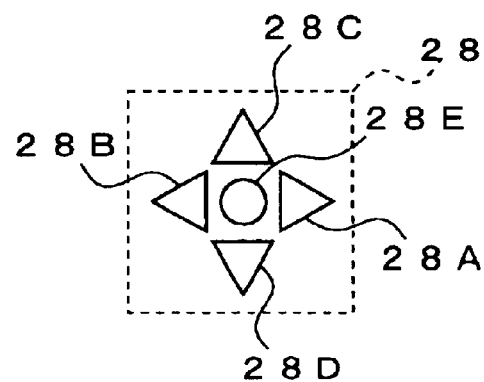
FIGS. 7A and 7B are conceptual drawings showing an example of cursor display in an example of the cross hair key 28 and the liquid display monitor 33 of the present invention.
Figure 7B:
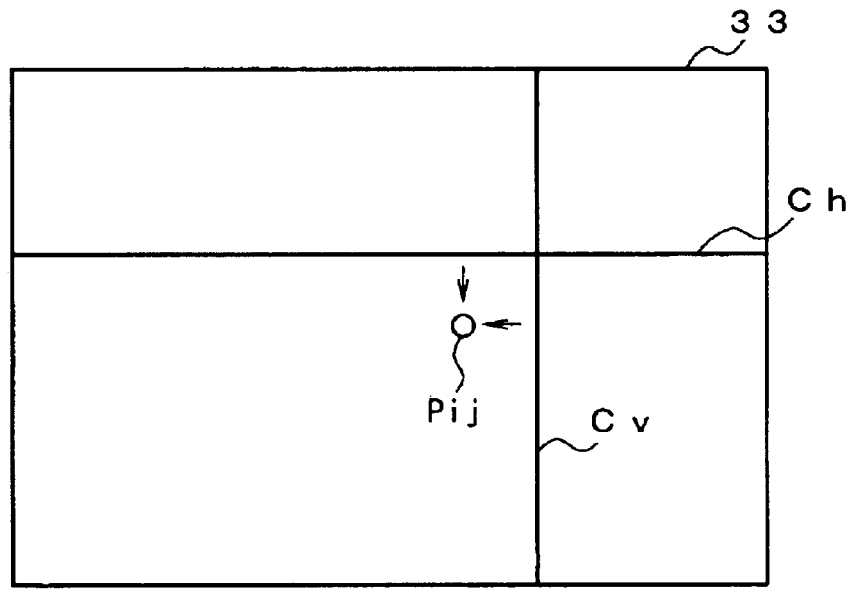

When the triangular key facing rightward 28A is pressed, it is operated so that the vertical cursor Cv is moved to the right direction on the screen of the liquid crystal display monitor 33 shown in FIG. 7, and when the triangular key facing leftward 28B is pressed, it is operated so that the vertical cursor Cv is moved to the left direction on the screen. Moreover, when the triangular key facing upward 28C is pressed, it is operated so that the horizontal cursor Ch is moved to the upper direction, and when the triangular key facing downward 28D is pressed, it is operated so that the horizontal cursor Ch is moved to the lower direction. Accordingly, for example, the vertical cursor Cv and the horizontal cursor Ch can be overlapped at the defective pixel Pij which is white and bright. In this state, when the determination button 28E is pressed, the writing of the position of the defective pixel to the EEPROM 26 can be determined.

Subsequently, an example of an internal constitution of the defect correction LSI 25 will be described below. The defect correction LSI 25 shown in FIG. 8 has the serial communication block 51, the memory controller block 52, the timing generation block 53, the data writing and reading block 55, the correction signal generation block 56 and the correction block 57.

The serial communication block 51 is connected to the microprocessor 30 for control described above, and it is operated so that a serial communication is performed with the microprocessor 30 and various kinds of control signals Sc are output into the memory controller block 52 and the timing generation block 58. The control signal Sc is generated by decoding the defect detection control information D2, the defect correction control information D3 and the writing and reading control information D4, which have been transferred from the microprocessor 30.

In the timing generation block 53, various kinds of timing signals used in an internal LSI on the basis of synchronous signal input into the relevant defect correction LSI 25. For example, the vertical position information Dv and the data writing and reading signal WE are generated on the basis of the synchronous signal S4. The horizontal position information Dh is output into the correction signal generation block 56, the horizontal position information Dh and the vertical position information Dv are output into the memory controller block 52 and the correction block 57, and the data writing and reading signal WE is output into the data writing and reading block 55.

Moreover, the memory controller block 52 is connected to the serial communication block 51, and it is operated so that the memory control signal Sm and the address are output into the EEPROM 26 on the basis of the defect determination signal Se, the control signal Sc, the horizontal position information Dh and the vertical position information Dv, the writing control of the positional information D1 of the defective pixel is performed, and its reading control is performed. The defect determination signal Se is obtained on the basis of the determination results which compare the reference value Dr and the digital picture image signal (image acquisition information) Din for three color display of R, G and B in the correction block 57 constituting the defect detection means, and obtained at the time when the position of the defective pixel of the solid state image element array 21 is detected.

The digital picture image signal Din for three colors display is classified into G data input and B data input and supplied from each of the A/D conversion circuit 24 to the correction block 57.

The data writing and reading block 55 is an example of an information writing and reading means, it is operated so that the positional information D1 at the time when writing to the EEPROM 26 on the basis of the writing and reading signal WE is held for a while and the positional information D1 at the time when reading from the EEPROM 26 is held for a while. The correction signal generation block 56 is connected to the data writing and reading block 55, and it is operated so that the defect correction signal (defect correction pulse) Sr, Sg and Sb for three colors display for R, G, and B are generated on the basis of the position information D1 due to the data writing and reading block 55 and the horizontal position information Dh from the timing generation block 53.

The correction block 57 constituting the defect correction means as well is connected to this correction signal generation block 56, and it is operated so that when the defect correction signals Sr, Sg and Sb of R, G and B respectively are input, straight line interpolation data for three colors display of R, G and B is generated on the basis of front value and the rear value of the defective pixel of the digital picture image signal Din. The straight line interpolation data is generated for R correction output, G correction output and B correction output. A digital picture image signal Dout comprising R correction output from this correction block 57 to the liquid crystal display monitor 33, G correction output and B correction output is output.

Subsequently, an example of an internal constitution of the correction block 57 of the defect correction LSI 25 will be described below. The correction block 57 shown in FIG. 9 constitutes the digital picture signal pass circuit by the solid state image means 11 for red color, and simply consisted of 5 pieces of the resisters 71–73, 75 and 79, 2 pieces of the data selectors 77, 78, 2 pieces of the adders 76, 710, one piece of the comparator 74 and the cursor generation section 711. As for the digital picture image signal pass circuit of the solid state image means 11 for green and blue color, because it takes the same constitution with the digital picture image signal pass circuit of the solid state image means 11 for red color, description for it is omitted.

In this example, as for the correction method of a defective pixel, supposing that the digital picture image signal Din of a defective pixel is replaced with mean value of left and right pixel of the defective pixel. It should be noted that although correction methods themselves of a defective pixel of a variety of methods further referring to upper and lower pixels and diagonal pixels are known, the present invention is not limited to these correction methods.

Figure 9:
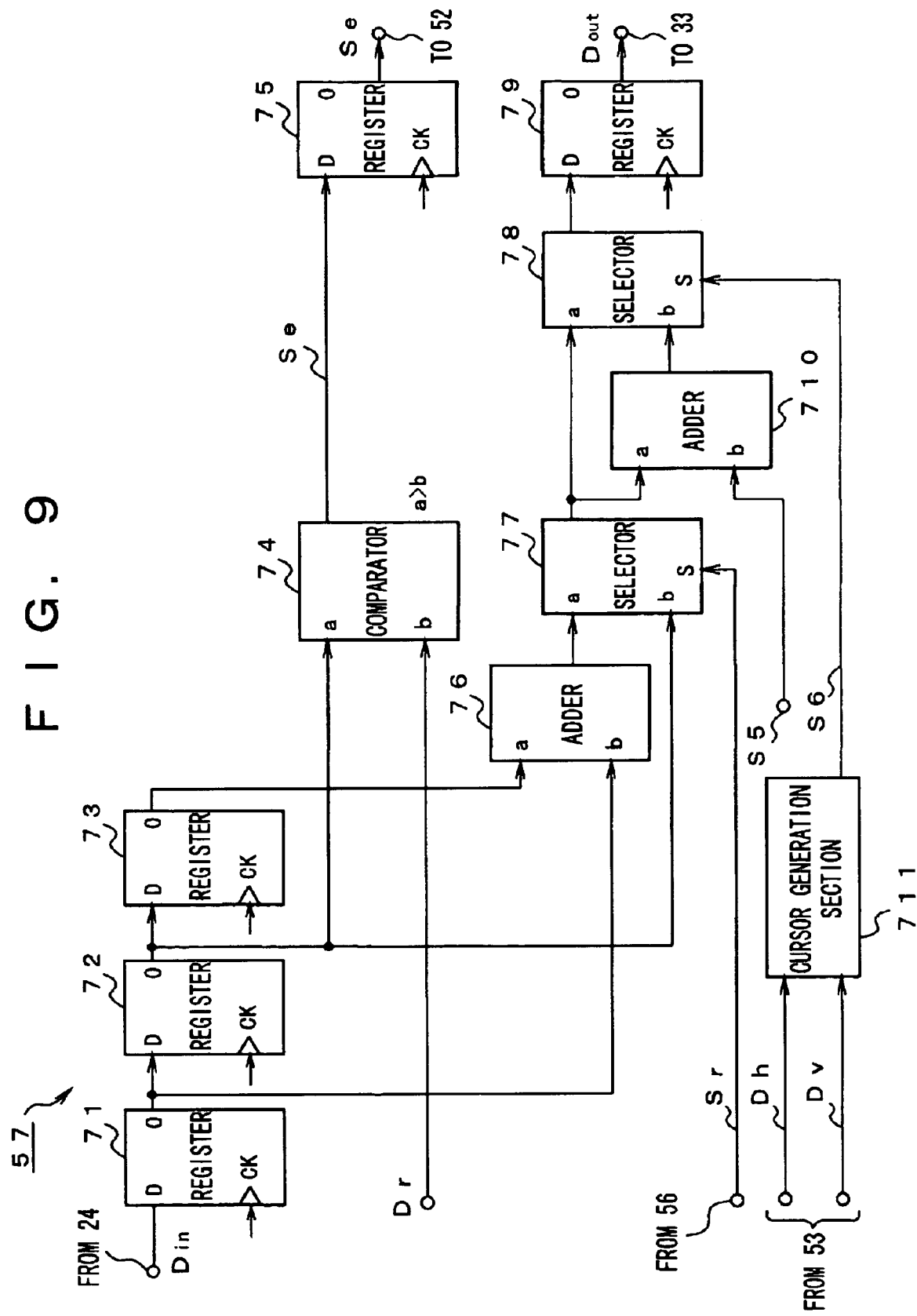
FIG. 9 is a block diagram showing an example of internal constitution of the correction block 57 of the present invention.

In the correction block 57 shown in FIG. 9, 3 pieces of the register 71–73 are cascaded (subordinately). Specifically, it is operated so that an output O of the first register 71 is connected to an input D of the second register 72, an output O of the register 72 is connected to an input D of the third register 73, and when the digital picture image signal Din is input into the register 71, the three pixels portion consecutive to the horizontal direction is held at the same time in 3 pieces of the registers 71–73.

The comparator 74 is connected to the output O of this register 72, when the automated writing mode is performed, luminance value of the central pixel and the reference value Dr input as a threshold value are compared, and whether or not the digital picture image signal Din due to the relevant pixel is the digital picture image signal Din due to the defective pixel is determined. The register 75 is connected to the comparator 74, in the case where the relevant digital picture image signal Din is due to a defective pixel, a defect determination signal Se indicating that the defective pixel is detected is held.

Figure 8:
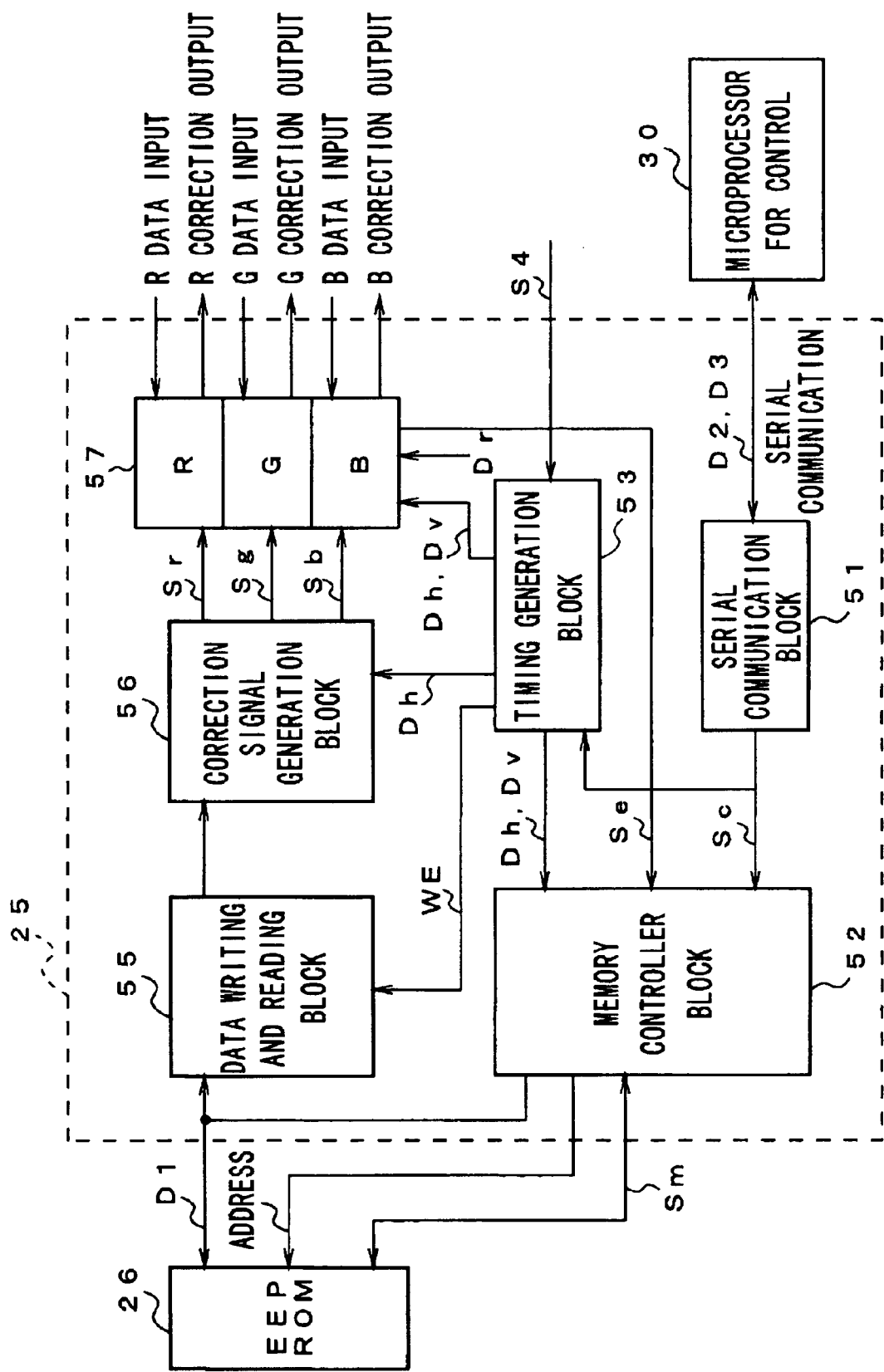
FIG. 8 is a block diagram showing a constitutive example of defective correction LSI 25 and its peripheral circuit of the present invention.

Since this defect determination signal Se is output into the memory controller block 52, described in FIG. 8, it is operated so that in the memory controller block 52 the horizontal and vertical counter values are held on the basis of the defect determination signal Se, and the positional information D1 of the defective pixel is written in the EEPROM 26 on the basis of this.

Moreover, it is operated so that an output O of register 71 is not only connected to an input b of the adder 76, an output O of the register 73 is connected to an input a of the adder 76 as well, and the mean value of both lateral pixels of the central pixel is always output. It is operated so that an output of the adder 76 is connected to an input a of the data selector 77, an output O of the register 72 is connected to an input b of the data selector 77, and any one of an output of the adder 76 or an output of the register 72 is selected on the basis of the defect correction signal Sr input from the correction signal generation block 56. It should be noted that in the automated writing mode a defect correction signal Sr is stopped and if there is a defective pixel, immediately it becomes such a state that the digital picture image signal Dout of the defective pixel is output from the data selector 77.

The correction signal generation block 56 is connected to a control input S of this data selector 77, and it is operated so that when the digital picture image signal Din of the defective pixel is just held during correction operation, a defect correction signal Sr is generated. For example, in the correction signal generation block 56, a defect correction signal Sr is generated by comparing the horizontal and vertical counter values synchronized with the digital picture image signal Din and the positional information D1 from the EEPROM 26. At this moment, the data selector 77 selecting the central pixel side b so far is switched to the average value side a on the basis of a defect correction signal Sr, whereby the data selector 77 will output the digital picture image signal Dout instead of the digital picture image Dout of the defective pixel and adjusted.

An input a of the adder 710 is connected to an output of the data selector 77, a cursor display luminance signal S5 is supplied to an input b of this adder 710, and it is operated so that a cursor display luminance signal S5 is superimposed on the digital picture image signal Dout of the defective pixel. Moreover, an input a of the second data selector 78 is connected to an output of the data selector 77, and an input b of the data selector 78 is connected to this adder 710 it is operated so that any one of a digital picture image signal Dout of the defective pixel superimposed on a cursor display luminance signal S5 based on a cursor display pulse S6 or a digital picture image signal Dout after correction but without superimposing on a cursor display luminance signal S5 is selected.

The adder 710 provided between the data selector 77 and the data selector 78 may be omitted. In the case where the adder 710 is provided, even if a white and bright defective pixel and the horizontal cursor Ch and the vertical cursor Cv are superposed, the position of the defective pixel can be clearly indicated. In the case where the adder 710 is not provided, at the time when the horizontal cursor Ch and the vertical cursor Cv are superimposed on a white and bright defective pixel, it is operated so that the display due to the defective pixel is deleted. It can be an index determining whether or not the horizontal cursor Ch and the vertical cursor Cv are superimposed on the defective pixel.

The cursor generation section 711 is connected to a control input S of the data selector 78, and a cursor display pulse S6, which synthesizes a horizontal cursor display signal generated by comparing the register value indicating the position of the horizontal cursor Ch and a vertical counter value synchronous with a digital picture image signal Din, is generated. An output of the adder 76 or an output of the register 72 is selected by this cursor display pulse S6. In the timing generation section 53, the horizontal counter value and the vertical counter value are obtained on the basis of a control signal Sc decoding a defect detection control information D2 sent to the serial communication block 51, a horizontal position information Dh and a vertical position information Dv occurred in the timing generation block 53. It should be noted that it will be good that the cursor generation section 711 is incorporated together inside of the timing generation section 53.

Subsequently, a cursor display signal S5 can be superimposed on the picture image by switching the data selector 78 due to the cursor display pulse S6. In this case, the intersection of the horizontal cursor Ch and the vertical cursor Cv is superimposed on the position of the defective pixel by the manual operation using the cross hair key 28 with the determination button, and the when determination button 28E is pressed, then, the register value in the cursor generation section 711 at the time indicates the position of the defective pixel, therefore, the positional information D1 of the defective pixel can be written in the EEPROM 26 on the basis of this register value.

Figure 10:
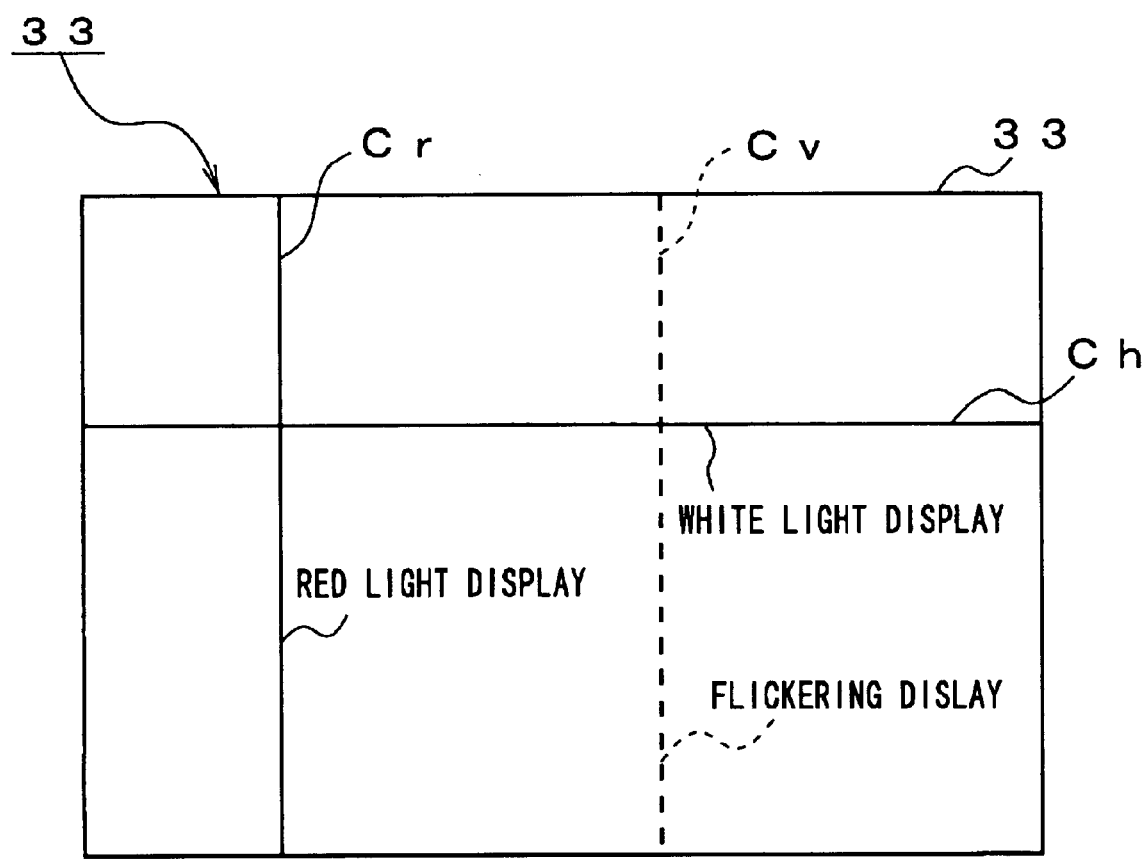
FIG. 10 is a conceptual drawing showing an example of cursor multiple colors display in the liquid display monitor during Description of the Preferred Embodiments manual writing mode of the present invention.

Subsequently, an example of cursor display during the manual writing mode extended for three channels of R, G and B will be described below. The display positions of the horizontal cursor Ch and the vertical cursor Cv shown in FIG. 10 can be moved upward and downward, and leftward and rightward on the basis of a cursor display luminance signal S5 and a cursor display pulse S6 due to the cursor generation section 711, and the positional information D1 (correction data) of the defective pixel can be additionally written by superimposing the intersection of the cursors on the white and bright defective pixel that the operator wants to adjust and sending a writing command.

As for this example, this is a case where picture images are divided into three of red, green and blue colors concerning with the solid state image element array 21 and acquired, the horizontal cursor Ch operated in the vertical direction on the screen of the liquid display monitor 33 is displayed in white and the vertical cursor Cv operated in the horizontal direction on the screen is displayed in red, green or blue color.

In this example, the writing operation of the positional information D1 of the defective pixel is performed at every one channel. Therefore, RGB flag for channel designation is provided in upper address shown in FIG. 6 as a control command. For example, when flagging R flag and entering into the manual writing mode, as for the vertical cursor Cv operated in the horizontal direction on the screen of the liquid display monitor 33, correction point marker Cr of red color is lighted and displayed in the case of the position of the defective pixel of red color already recorded in the EEPROM 26.

As for the position of the defective pixel of red color to be recorded in the EEPROM 26 from now on, in order to distinguish from the marker Cr, the vertical cursor Cv is lighted and displayed in red color. Green and blue colors are also similarly lighted and displayed or flickered and displayed. In this way, since the horizontal and vertical cursors themselves have channel display function, the position of the defective pixel is easily retrieved.

Subsequently, an example of an operation of the defective pixel recording method of the 3 CCD camera 200 of the present invention will be described below. It should be noted that a flowchart of an example of an operation of the solid state image device 100 shown in FIG. 4 will be again referred to.

In this example, supposing a case of a recording method of a defective pixel in the 3 CCD camera for red, green and blue colors, in which the solid state image element Pij of 480 lines in the vertical direction and 640 pixels in the horizontal direction is arranged in a matrix shape, and in which the position of the defective pixel occurred in the respective solid state image means 11 for red, green and blue colors is displayed in time dividing on the screen, the position of the defective pixel displayed on the screen is manually operated and selected and the positional information D1 of the defective pixel selected here is recorded in the EEPROM 26.

Moreover, a case is cited in which, at the time when the positional information D1 of the defective pixel is recorded in the EEPROM 26, the writing area from the first line to the $480^{th}$ line is prepared in the EEPROM 26 so that 2 pieces portion of the defective pixels per one line is previously written, and subsequently, for example, the positional information D1 of the defective pixel occurred on the relevant line of the solid state image means 11 for red color is recorded in the EEPROM 26 corresponding to the relevant line.

On the premise of this, in the positional information D1 of the defective pixel newly occurred is recorded, first, the writing mode is set using the mode selection switch 27 shown in FIG. 5 in the step A1 of the flowchart shown in FIG. 4. At this instance, in a state where an incident light to the relevant 3 CCD camera 200 is intercepted, the position of the defective pixel occurred in the solid state image means 11 for red color is displayed on the screen by the liquid crystal display monitor 33. Subsequently, transfer to the step A2, the positional information D1 of the defective pixel is recorded in the EEPROM 26 corresponding to the case where the manual writing mode is set, and the case where the automated writing mode is set.

(1). A case where the manual writing mode is set:

In order that the position of the defective pixel displayed on the screen should be selected by an operator, transfer to the step A3, the horizontal cursor Ch and the vertical cursor Cv are displayed at the same time on the screen of the liquid crystal display monitor 33. In this manual writing mode, in the correction block 57 shown in FIG. 9, when the digital picture image signal Din is input into the register 71, it is operated so that the digital picture image signal Din of 3 pixels portion consecutive in the horizontal direction is held in 3 pieces of the registers 71~73. In the adder 76, it is constituted so that the average value of both lateral pixels of the central pixel is always output, but in the manual writing mode, a defective correction signal Sr is stopped, and if there is a defective pixel, immediately it becomes to a state where the digital picture image signal Dout of the defective pixel is output into the data selector 77.

Furthermore, in the adder 710, it is operated so that a cursor display luminance signal S5 is superimposed on the digital picture image signal Dout of the defective pixel, whereby in the manual writing mode, the horizontal cursor Ch and the vertical cursor Cv are superimposed on the digital picture image signal Din and can display it.

Subsequently, in the step A4, whether or not the positional information D1 of the defective pixels of 2 pieces per one line is recorded in the EEPROM 26 is determined. At this moment, whether the positional information D1 of one line is present or not is determined by accessing the writing area from the first line to the 480th line.

In the case where the positional information D1 of the defective pixels of 2 pieces portion per one line is not recorded in the EEPROM 26, transfer to the step A6, in order that the position of the defective pixel should be made selected, according to an output of the cross hair key 28 with the determination button operated by the operator, not only the horizontal cursor Ch is manually operated in the vertical direction and but also the vertical cursor Cv is manually operated in the horizontal direction.

Then, when the operator superimposes the intersection of the horizontal cursor Ch and the vertical cursor Cv on the position of the defective pixel, the determination button 28E of the cross hair key 28 is pressed in order to determine the writing in the step A7. Subsequently, the positional information D1 of a new defective pixel is recorded in the EEPROM 26.

It should be noted that, in the step A4, in the case where the positional information D1 of the defective pixels of 2 pieces per one line is already recorded in the EEPROM 26, transfer to the step A5, and whether or not the positional information D1 of the defective pixel recorded in the EEPROM 26 is determined. In the case where a defective pixel larger than the defective pixel recorded in the EEPROM 26 is found out, the positional information D1 of the defective pixel recorded in the EEPROM 26 is deleted. This is for the purpose of the positional information D1 of a new defective pixel instead of the old positional information D1 is written.

Subsequently, transfer to the step A6, in order that the position of the defective pixel should be selected, the operator manually operates not only the horizontal cursor Ch in the vertical direction, and manually operates but also the vertical cursor Cv in the horizontal direction. Then, when the operator superimposes the intersection of the horizontal cursor Ch and the vertical cursor Cv on the position of the defective pixel, in the step A7, the determination button 28E is pressed in order to determine the writing, whereby in the step A11, the old positional information D1 can be rewritten into the positional information D1 of a new defective pixel.

(2). A case where the automated writing mode is set:

In order to automatically detect a defective pixel, transfer to the step A8, the solid state image means 11 for red color of 480 lines ×640 pixels is in turn line-scanned by the correction block 57, and the luminance which the respective solid state image means 11 have converted photoelectrically is measured. Subsequently, transfer to the step A9, respective luminance due to the solid state image means 11 are compared with the reference value Dr previously set. The positional information D1 of the defective pixel occurred on the relevant line is detected corresponding to the comparative results. Here, in the case where the respective luminance is larger than the reference value Dr previously set, transfer to the step A10, and whether or not the positional information D1 of the defective pixels of 2 pieces per one line is already recorded in the EEPROM 26 is detected.

In the case where the positional information D1 of the defective pixels of 2 pieces is already recorded in the EEPROM 26, transfer to the step A12. In the case where the positional information D1 of the defective pixels of 2 pieces is not recorded in the EEPROM 26, transfer to the step A11, the positional information D1 is recorded in the EEPROM 26.

At this moment, in the correction block 57, when the digital picture image signal Din is input into the register 71, it is operated so that the digital picture image signal Din of the 3 pieces portion consecutive in the horizontal direction in the 3 pieces of the register 71–73. In this automated writing mode, whether or not the digital picture image signal Din due to the relevant pixel is the digital picture image signal Din due to the defective pixel is determined by comparing luminance value of the central pixel and the reference value Dr. In the case where the relevant digital picture image signal Din is due to defective pixel, a defect determination signal Se indicating that the defective pixel is detected is held.

Since this defect determination signal Se is output into the memory controller block 52 shown in FIG. 8, it is operated so that in the memory controller block 52, the horizontal and vertical counter values are held on the basis of the defect determination signal Se, and the positional information D1 of the defective pixel is written in the EEPROM 26 on the basis of this. It should be noted that in the automated writing mode, the defect correction signal Sr is stopped, if there is a defective pixel, immediately it becomes a state where the digital picture image signal Dout of the defective pixel is output from the data selector 77.

Moreover, the respective luminance due to the solid state image means 11 for red color is smaller than the reference value Dr previously set, transfer to the step A12, whether or not the writing of the positional information D1 of the defective pixel is entirely completed is determined. In the case of the manual writing mode, the termination instruction from the operator is detected and the writing operation is terminated. In the case of the automated writing mode, the termination of the line scanning is detected, and the writing operation is terminated. In the case where the positional information D1 of the defective pixel is not entirely completed, return to the step A2, the process of the step A3~A11 will be continued.

As for the correction process of the defective pixel, in the correction block 57 shown in FIG. 9, when the digital picture image signal Din is input into the register 71, it is operated so that the digital picture image signal Din of 3 pixels consecutive in the horizontal direction in the 3 pieces of the register 71~73. In the adder 76, it is operated so that the average value of both of lateral pixels of the central pixel is always output. In the first data selector 77, it is operated so that either of an output of the adder 76 or an output of the register 72 is selected on the basis of the defective correction signal Sr.

When the digital picture image signal Din of the defective pixel is just held in the register 72 during correction operation in the data selector 77, it is operated so that the defect correction signal Sr is generated in the correction signal generation block 56. At this instance, in the correction signal generation block 56, the defect correction signal Sr is generated by comparing the horizontal counter value and the vertical counter value which are synchronized with the digital picture image signal Din and the positional information D1 from the EEPROM 26.

The data selector 77 selecting the central pixel side b so far is switched to the average value side a on the basis of the defect correction signal Sr, whereby the data selector 77 will output the digital picture image signal Dout adjusted and instead of the digital picture image signal Dout of the defective pixel. In the second data selector 78, it is operated so that the digital picture image signal Dout not superimposing on the cursor display luminance signal S5 as it is after correction is selected on the basis of the cursor S6. Accordingly, in the case where an image acquisition information due to a red and bright defective pixel is included in the digital picture image signal Sin, the digital picture image signal Dout removing the image acquisition information due to the defective pixel from the picture output information by the correction operation can be output.

In this way, in the present embodiment of the present invention, when the defect correction system is made to be an integrated circuit, the manual writing mode besides the automated writing mode is provided, therefore, in the case where a new defective pixel is occurred after shipping the product of the finely manufactured 3 CCD camera 200, the positional information D1 can be easily written in the EEPROM 26 for defective pixel which cannot be dealt with in the automated writing mode (a white and bright pixel such as one repeating flickering periodically and a defective pixel which cannot be deleted from the limitation of the defect correction circuit and the like) without using any special writing jig.

Moreover, according to the present embodiment, since all of the defect correction, detection and cursor display can be carried out within the identical defect correction LSI 25, it does not need any severe timing control at all, a defect correction system of self completed type which is not influenced with certain system delay at all can be constituted. Accordingly, the relevant defect correction system can be easily mounted on various kinds of models of CCD cameras.

In this example, although the case where as for the number of the defective pixel adjustable per one line, m, the expression m=2 is held, has been described, it is not limited to this, and it will be good that a defect correction system dealing with more than two defective pixels per one line. Moreover, it will be good that the liquid crystal display monitor 33 is embedded within the 3 CCD camera just like a video camera, and it will be also good that it is connected to the outside just like industrial camera.

Briefly, the positional information D1 of the defective pixel can be written in the EEPROM 26 without using any special jig except a CCD camera and a monitor. Therefore, the service section can easily deal with the defective pixel occurred, for example, in the market after starting the sales of the cameras. It is not necessary to keep an exclusive jig.

By the way, if a manual writing mode is performed using an exclusive jig in the outside of the 3 CCD camera, defect correction signals Sr, Sg and Sb accurately adjusting a system delay portion from the point performing the correction within its camera to camera output must be prepared. At this point, since its correction amount per camera model is defined in a self completed manner according to methods of the present invention, the problem of owning jointly a common writing jig is also cleared.

As described above, according to solid state image devices of the present invention, a position selection means manually operated is provided so as to select a defective pixel on the screen, and it is operated so that the positional information selected here is recorded in the memory means.

Accordingly, in the case where a defective pixel is occurred after shipping the product of the finely manufactured solid state image element, the positional information of the defective pixel can be easily written in memory means without using any special jig.

According to defective pixel recording methods of solid state image devices of the present invention, the devices are operated so that the position of the defective pixel occurred in the solid state image element is displayed on the screen, after the position of the defective pixel indicated on the screen is manually operated and selected, the positional information of the defective pixel selected here is recorded in memory means.

Accordingly, in the case where a defective pixel is occurred after shipping the product of a finely manufactured solid state image element, the positional information of the defective pixel can be written in memory means without using any special writing jig. In addition, as for correction for a defective pixel occurred posteriorly, it is can be handled with flexibility.

The present invention is extremely preferable to apply it to CCD cameras arranging solid state image elements in a high density and in a matrix shape.

What is claimed is:

1. A solid state image device in which solid state image elements of N lines in a vertical direction and M pixels in a horizontal direction are arranged in a matrix shape, said solid state image elements being grouped in sets of red, green and blue colored pixels; said solid state image device comprising:

display means for displaying a position of a defective pixel occurred in said solid state element on a screen, a horizontal cursor operated in the vertical direction on said screen and displayed in white, and a vertical cursor operated in the horizontal direction on said screen and displayed in red, green or blue based on the color of the defective pixel at said position and flickering if the defective pixel is not previously known;

position selection means for selecting a position of a defective pixel on a screen of said display means, the position selection means having a manual writing mode and an automated writing mode; in said automated writing mode the position of said defective pixel is automatically determined by scanning an acquisition image acquired by said solid state image device and comparing a luminance value for each pixel with a predetermined luminance value, and memory means for recording positional information of said defective pixel selected by said position selection means.

2. A solid state image device according to claim 1, wherein said position selection means has, horizontal cursor operated in vertical direction on a screen of said display means, vertical cursor operated in horizontal direction on said screen, and writing determination button operated so as to be pressed at an intersection of said horizontal cursor and vertical cursor.

3. A solid state image device according to claim 1, wherein a writing area from first line to the N line is assigned so as to previously write positional information of defective pixels of m pieces portion per one line, and it is performed so that positional information of a defective pixel occurred on the relevant line of said solid state image element is recorded in a writing area corresponding to the relevant line of said memory means.

4. A solid state image device according to claim 1, wherein defect detection means for detecting positional information of a defective pixel occurred on the relevant line of said solid state image element, and information writing and reading means for recording positional information of a defective pixel detected by said defect detection means in a writing area of said memory means corresponding to the relevant line and reading positional information from said writing area are provided.

5. A solid state image device according to claim 1, wherein information rewriting means for deleting positional information of a defective pixel recorded in said memory means and rewriting the relevant positional information is provided.

6. A solid state image device according to claim 1, wherein in said defect detection means, line scanning in turn a solid state image element of N lines and M pixels and measuring luminance by respective solid state image element in a state where an incident light to said solid state image element is intercepted, comparing respective luminance by said solid state image element and reference luminance previously set, and detecting positional information of a defective pixel occurred on the relevant line corresponding to said comparative results.

7. A solid state image device according to claim 1, wherein as for image acquisition information of a solid state image element of a defective pixel recorded in said memory means, at least defect correction means for interpolating image acquisition information of a solid state image element of said defective pixel is provided based on image acquisition information by solid state image elements in front and in the rear of said defective pixel.

8. A defective pixel recording method in a solid state image device in which solid state image elements of N lines in a vertical direction and M pixels in a horizontal direction are arranged in a matrix shape, wherein said solid state image elements are grouped in sets of red, green and blue colored pixels; comprising the steps of:

displaying a position of a defective pixel occurred in said solid state image element on a screen, a horizontal cursor operated in the vertical direction on said screen and displayed in white, and a vertical cursor operated in the horizontal direction on said screen and displayed in red, green or blue based on the color of the defective pixel at said position and flickering if the defective pixel is not previously known;

selecting a position of a defective pixel displayed on said screen, including an automated writing mode in which the position of said defective pixel is automatically determined by scanning an acquisition image acquired by said solid state image device and comparing a luminance value for each pixel with a predetermined luminance value, and recording positional information of said selected defective pixel in memory means.

9. A defective pixel recording method of a solid state image device according to claim 8, wherein when a position of a defective pixel displayed on said screen is selected, displaying horizontal cursor and vertical cursor on said screen simultaneously, manually operating not only said horizontal cursor in vertical direction and manually operating but also said vertical cursor in horizontal direction, and determining a writing by superimposing an intersection of said horizontal cursor and vertical cursor on a position of said defective pixel.

10. A defective pixel recording method of a solid state image device according to claim 8, wherein when a defective pixel which is larger than a defective pixel recorded in said memory means, is detected positional information of a defective pixel recorded in said memory means is deleted and rewritten into new positional information.

11. A defective pixel recording method of a solid state image device according to claim 8, wherein when positional information of said defective pixel is recorded in memory means, preparing a writing area from first line to Nth line in said memory means so as to previously write defective pixels of m pieces portion per one line, and subsequently, recording positional information of a defective pixel occurred on the relevant line of said solid state image element in a writing area of said memory means corresponding to the relevant line.

* * * * *